United States Patent [19]

Miles

[11] 4,321,480
[45] Mar. 23, 1982

[54] POSITIVE DIFFERENTIAL ALTERNATING CURRENT SWITCHING MEANS

[75] Inventor: Gregory M. Miles, Minneapolis, Minn.

[73] Assignee: Honeywell Inc., Minneapolis, Minn.

[21] Appl. No.: 121,630

[22] Filed: Feb. 14, 1980

[51] Int. Cl.³ .................... H01H 47/24; H01H 47/32
[52] U.S. Cl. ................................. 307/117; 307/109; 307/252 B; 361/172; 431/79
[58] Field of Search ............... 307/116, 117, 140, 98, 307/109, 252 B; 361/172, 159; 333/17; 340/660, 578; 250/554; 315/159, 199, 275; 431/79, 50, 69

[56] References Cited

U.S. PATENT DOCUMENTS

| | | | |
|---|---|---|---|
| 3,384,763 | 5/1968 | Harris | 307/252 |
| 3,483,429 | 12/1969 | Engel et al. | 315/159 X |
| 3,763,395 | 10/1973 | Shilling et al. | 315/307 |
| 3,763,396 | 10/1973 | Shilling | 315/307 |
| 3,872,320 | 3/1975 | Juskewicz | 307/117 |
| 3,898,553 | 8/1975 | Van Boggett | 323/19 |
| 3,900,763 | 8/1975 | Turner | 315/156 |

Primary Examiner—Joseph W. Hartary
Assistant Examiner—S. D. Schreyer
Attorney, Agent, or Firm—Alfred N. Feldman

[57] ABSTRACT

A solid state switching circuit using a capacitive feedback that creates a positive differential. This positive differential overcomes any half-wave operation of the solid state switches caused by lack of symmetry in its gating circuit.

7 Claims, 4 Drawing Figures

POSITIVE DIFFERENTIAL ALTERNATING CURRENT SWITCHING MEANS

BACKGROUND OF THE INVENTION

The control of various types of electrical loads by operating solid state switch means in response to a condition sensing means is well known. Typically a solid state switch means, such as a triac, is controlled in response to a voltage variation at its gate determined by the magnitude of a slowly varying resistance in a condition sensing circuit. The slowly varying resistance would typically be an element such as a thermistor or a cadmium sulfide cell. In order to create as definite a switching function as possible, the gate of the triac is connected to the condition responsive element by a voltage breakdown type of device or silicon bilateral switch.

Even though in theory this provides a definite switching point for the triac, actually two possible switching conditions are created because the bilateral switches are not perfectly symmetrical. That is, the breakdown potential from positive to negative, and from negative to positive, may be slightly different. In certain cases where the system is operated with an alternating current potential in the sensing or gate circuit, the triac can be caused to be gated on one-half cycle of the applied alternating current voltage while remaining nonconductive on the reverse half cycle of the applied alternating current potential. This is referred to as "half-waving".

If the condition being sensed changes quite rapidly, this problem is relatively unimportant. If a very slowly changing condition exists, that is one in which the impedance of the sensing element is changing relatively slowly to the applied alternating current potential, the two halves of the gating signal to the triac can be sufficiently different so that the triac will operate on one-half cycle of the applied alternating current and will not conduct on the reverse half cycle. In certain types of applications of cadmium sulfide sensors to fuel burners, this type of operation can be very undesirable.

SUMMARY OF THE INVENTION

In the present invention a triac or similar type of alternating current solid state switch is connected to control an inductive type of load, such as a fuel burner control relay. The gate of the triac is connected through the bilateral switch to a voltage divider which includes an impedance that changes with the sensed condition. This impedance typically would be a cadmium sulfide cell. In the circuit of the present invention, a capacitor has been added to couple a voltage from the inductive load to the sensor circuit in order to create a positive differential when the load is energized. Upon initially energizing the load, the capacitor couples a voltage to the gate of the triac on the reverse half cycle insuring that the bilateral switch has a sufficient voltage applied to it to break down and cause the triac to operate on the reverse half cycle as well as the first half cycle of operation.

With the present capacitor feedback arrangement a positive differential alternating current switching means has been created that insures that the circuit will not operate in the half-wave mode, and further this capacitor insures a definite positive differential for the control of the load so that when the load is to be deenergized, the triac is driven off in a positive manner by the effects of the feedback capacitor.

DESCRIPTION OF THE PREFERRED EMBODIMENT

Figure 1:
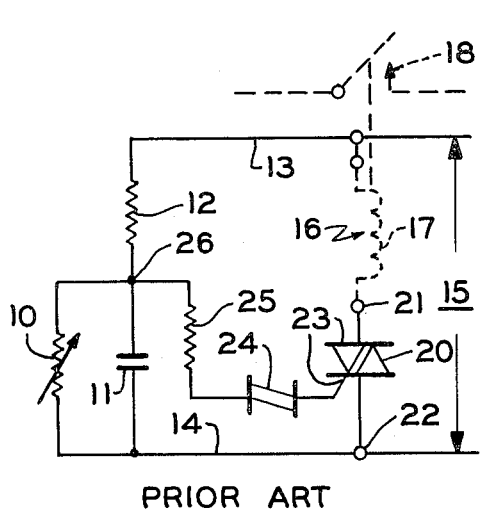
FIG. 1 is a schematic diagram of a simplified prior art condition control circuit.

In FIG. 1 there is disclosed a schematic diagram of a prior art condition control circuit. This prior art circuit typically has been used in oil primary controls to control the power to a relay in accordance with the resistance of a cadmium sulfide cell. The prior art circuit of FIG. 1 will be described in detail to lay a basis for an explanation of an operation of the inventive positive differential switching circuit means of FIG. 3.

In FIG. 1 a condition responsive element means 10 is disclosed as a variable resistor. In a fuel burner or oil primary control circuit this would be a cadmium sulfide type cell. Connected across the condition responsive element means 10 is a capacitor 11 and the parallel combination of the resistor 10 and the capacitor 11 are connected in series with a further fixed resistance 12. The sensing element 10, the capacitor 11, and the resistor 12 form a condition responsive circuit means that is connected by a pair of conductors 13 and 14 to a source of alternating current voltage generally disclosed at 15.

Connected across the source of alternating current voltage 15 is an inductive load generally disclosed at 16 which, in fact, is a relay coil 17 and its associated contact 18. Connected in series with the relay coil 17 is a triac 20 that has a pair of terminals 21 and 22 so that the triac 20 can be connected in a series circuit with the relay coil 17 across the alternating current potential source 15. It is obvious that the conduction of current through the triac 20 will cause the relay coil 17 to be energized thereby causing the inductive load means 16 to be operative to control the contact 18.

The triac 20 further has a gate means 23 that is connected to a bilateral switch means 24 that is shown as a silicon bilateral switch. The bilateral switch means 24 is connected by a resistor 25 to a junction 26 between the fixed resistor 12 and the capacitor 11. The junction 26 varies in voltage as the condition responsive element means 10 varies in impedance.

OPERATION OF FIG. 1

The circuit of FIG. 1 will first be described as operating in a normal manner and then will be described in a manner showing its undesirable half-wave mode of operation. If the resistance 10 is considered to be a small impedance, the application of potential to the circuit will provide a very small voltage to the switch 24 and it will not break over or conduct. As such, the triac 20 will not be conductive and the load means 16 will remain deenergized. If the resistance of the sensing means 10 changes to a substantial value, the voltage divider effect of the resistor 12 and the resistance 10 provides a relatively large voltage at the junction 26. This causes the bilateral switch means 24 to break down and apply a gating material to the triac 20 thereby allowing a bidirectional flow of current through the load means 16 thereby energizing the relay coil 16 and closing the contact 18.

To this point the problems of "half-waving" are not apparent. Due to any asymmetry in the gate trigger component or bilateral switch means 24, there is some small range of resistance values of the sensing means 10 that will cause the bilateral switch means 24 to breakdown in one direction but not in the reverse direction of the applied alternating current voltage 15. This will drive the triac 20 into conduction on one-half cycle but will not allow it to remain in conduction after the lagging load current through the inductive load passes through the zero voltage point. This is described in some detail in connection with FIGS. 2(a) and 2(b).

Figure 2:
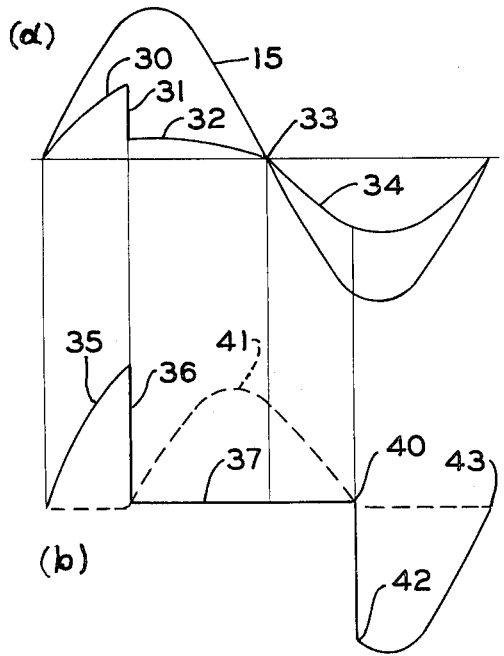
FIG. 2 is a series of wave forms of voltages and load currents for a circuit of the type disclosed in FIG. 1.

In FIG. 2(a) the applied alternating current voltage 15 is disclosed for reference. The voltage which appears across the capacitor 11 is disclosed at 30. It will be noted that the voltage initially starts to rise as the applied voltage since the capacitor 11 is in a simple voltage divider network. As soon as the voltage at junction 26 reaches the breakdown potential of the bilateral switch means 24, the voltage curve drops at 31 and trails off at 32 until the applied alternating current voltage 15 crosses the zero voltage line at 33. At this time the voltage at junction 26 takes on a negative slope as disclosed at 34, while the alternating current voltage finishes its normal negative swing. If the curve of the voltage 34 is insufficient to break down the bilateral switch means 24 on the negative swing, the triac 20 is kept off. This will be brought out in detail in FIG. 2(b).

In FIG. 2(b) the voltage appearing across the triac 20 is disclosed at 35. It will be noted that this voltage rises with the applied alternating current voltage 15 until the bilateral switch means 24 breaks down at 31. At this same point in time, the voltage across the triac 20 drops at 36 to roughly a zero potential at 37. It is understood that this voltage is not exactly zero as there is a voltage drop within the triac 20. The voltage remains at substantially zero until the triac 20 turns off at 40. The reason that the triac 20 remains in conduction past the time when the applied voltage passes through zero is due to the fact that the inductive load current, which is shown as curve 41 lags the applied alternating current voltage 15. As soon as the lagging load current 41 reaches the zero point 40, the triac 20 goes out of conduction. Since there is no gating potential available on the reverse half cycle because of the lack of symmetry of the bilateral switch means 24, the triac 20 remains off during the negative portion of the voltage curve beginning at 42. At 43 the voltage across the triac 20 again begins to go positive and the cycle of operation repeats itself. It will thus be apparent that the load current is a half wave load current through the triac 20 and its associated relay coil 17. Due to the sensitivity of the relays, this can cause a chattering, a failure of the relay, or the improper operation of an inductive load means.

Figure 3:
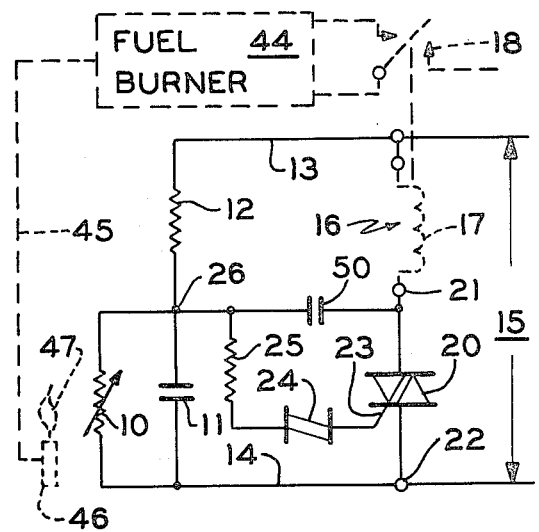
FIG. 3 is a schematic diagram of the improved condition control circuit.

The present invention overcomes this problem in a manner that will be disclosed in connection with FIG. 3. The same elements of the circuit will be numbered similarly to FIG. 1. The cadmium sulfide cell or sensing means 10, the capacitor 11, and the resistor 12 are again shown with a common junction 26. The inductive load means 16 including the relay coil 17 and its contact 18 are again shown connected to the terminals 21 and 22 across the triac 20. The alternating current voltage source 15 is supplied through a pair of conductors 13 and 14. The gate 23 of the triac 20 is connected to a bilateral switch means 24 and the resistance 25. To this point, the circuit of FIG. 3 is the same as that of FIG. 1.

In addition in FIG. 3, a fuel burner has been schematically disclosed at 44 as part of the inductive load means 16 for the condition control circuit. The fuel burner means 44 includes a connection 45 to a burner 46 with a flame 47. While a fuel burner means 44 is shown as part of the inductive load means 16, the type of inductive load means is not critical to the present invention. The present invention is completed by the addition of a capacitor 50 between the terminal 21 of the triac 20 and the junction 26 of the voltage divider network made up of the resistors 10 and 12 along with the capacitor 11. The capacitor 50 changes the method of operation of the circuit so as to provide a positive alternating current differential switching action that will be described in connection with FIGS. 4(a) and 4(b).

Figure 4:
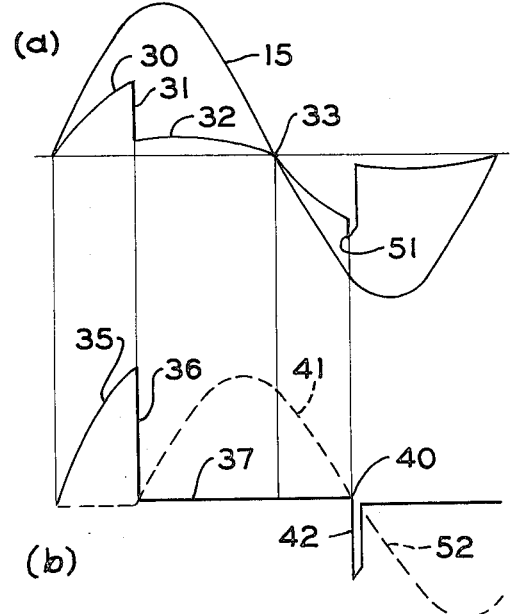
FIG. 4 is a series of wave forms showing the improved operation of the circuit of FIG. 3.

In FIG. 4(a) there is disclosed the alternating current voltage wave form 15 along with the rising voltage 30 that appears across the capacitor 11 and the bilateral switch means 24 until a breakdown point 31 is reached. At the breakdown point, the voltage at junction 26 drops and trails off as disclosed at 32 until it crosses the zero point at 33. As the applied alternating current voltage 15 declines to the zero point 33, the load current 41 in FIG. 4(b) is decreasing towards the zero point 40. However, when the load current 41 reaches zero at point 40, and the triac 20 begins to turn off at 42, the rapidly changing voltage across the triac 20 is coupled through the capacitor 50 to the capacitor 11 which increases the voltage at 51 (FIG. 4(a)) which is applied across the bilateral switch means 24 as a gating potential to the triac 20 causing the triac 20 to continue in conduction as disclosed at 52. The increase in voltage that is coupled through the capacitor 50 and to the capacitor 11 increased the voltage across the bilateral switch means 24 sufficiently to break it down and causes the triac 20 to be gated for the negative half cycle of the applied alternating current voltage 15. This pulse or trigger voltage in the capacitor 11 is also applied to the gate 23 of the triac 20 when the triac 20 starts to turn off on the following positive half cycle, or opposite polarity, so that once the triac 20 is gated into conduction on any one-half cycle it will remain in a conductive state until a significant change has taken place in the value of the condition responsive element or resistor 10.

For the triac 20 to turn off and remain off, the condition responsive element or sensor 10 must decrease to a value such that the voltage on the capacitor 11 plus the voltage coupled through the capacitor 50 will not breakdown the bilateral switch means 24. In that event the triac 20 will not conduct for that half cycle, and the next half cycle there will be no coupling through the capacitor 50 and the triac will remain off. The addition of the capacitor 50 will, therefore, eliminate any "half-waving" of the triac 20 and simultaneously produces a definite positive differential for the control of the load means 16 from a slowly changing resistive type of condition responsive element means 10.

The very troublesome operation of the type of circuit disclosed in the prior art of FIG. 1 has been made dependable and consistent by the addition of a critically placed capacitive element as disclosed in FIG. 3. The arrangement of elements in the condition responsive circuit means made up of the resistors 10, 12, and the capacitor 11 can be reversed in their positions without altering the effect of the capacitor 50 in the present invention. Other modifications to existing or prior art devices could be accomplished with the knowledge gained from the present disclosure, and therefore, the applicant wishes to be limited in the scope of his invention solely by the scope of the appended claims.

The embodiments of the invention in which an exclusive property or privilege is claimed are defined as follows:

1. A condition control circuit for controlling inductive load means, including: solid state switch means having load terminals adapted to connect the inductive load means to a source of alternating current; said solid state switch means further including gate means capable of controlling said switch means to in turn control the flow of an alternating current in said load means; condition responsive circuit means connected to said source of alternating current and including condition responsive element means which varies in impedance with a change in a sensed condition whereby said condition responsive circuit means provides a condition responsive voltage with a change in said sensed condition; bilateral switch means connecting said gate means to said condition responsive circuit means to apply said condition responsive voltage to control said solid state switch means; and capacitor means with one terminal connected to a load terminal common to said solid state switch means and said load means, and another terminal directly to said condition responsive voltage; said capacitor means coupling a single voltage change from said load means to said gate means to insure full wave conduction of said solid state switch means upon an initial conduction of said bilateral switch means upon said bilateral switch means responding to said condition responsive voltage.

2. A condition control circuit as described in claim 1 wherein said condition responsive circuit means includes voltage divider means having fixed impedance means and said condition response element means.

3. A condition control circuit as described in claim 2 wherein said fixed impedance means is a resistor, and said condition responsive element means is a variable resistor that varies in magnitude with said sensed condition.

4. A condition control circuit as described in claim 3 wherein said solid state switch means is a triac.

5. A condition control circuit as described in claim 4 wherein said inductive load means includes fuel burner means having an electromagnetic relay as a load controlled in response to said condition responsive variable resistor.

6. A condition control circuit as described in claim 5 wherein said condition responsive variable resistor is a cadmium sulfide cell; and said capacitor means is a capacitor.

7. A condition control circuit as described in claim 6 wherein said bilateral switch means is a silicon bilateral switch.

* * * * *